United States Patent
Apalkov et al.

(10) Patent No.: US 8,890,267 B2
(45) Date of Patent: Nov. 18, 2014

(54) METHOD AND SYSTEM FOR PROVIDING MAGNETIC JUNCTIONS HAVING A GRADED MAGNETIC FREE LAYER

(71) Applicants: Dmytro Apalkov, San Jose, CA (US); Vladimir Nikitin, Campbell, CA (US); Mohamad Towfik Krounbi, San Jose, CA (US)

(72) Inventors: Dmytro Apalkov, San Jose, CA (US); Vladimir Nikitin, Campbell, CA (US); Mohamad Towfik Krounbi, San Jose, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/691,873

(22) Filed: Dec. 3, 2012

(65) Prior Publication Data
US 2014/0151830 A1     Jun. 5, 2014

(51) Int. Cl.
*H01L 27/22* (2006.01)
*H01L 43/08* (2006.01)
*G11C 11/16* (2006.01)

(52) U.S. Cl.
CPC .............. *H01L 27/222* (2013.01); *H01L 43/08* (2013.01); *G11C 11/161* (2013.01)
USPC ................... 257/421; 257/E43.004; 365/158; 365/171

(58) Field of Classification Search
CPC ..... H01L 27/222; H01L 27/224; H01L 43/08; H01L 29/82; G11C 11/15; G11C 11/16; G11C 11/161
USPC .......... 257/421, E43.004, E29.323, E27.005, 257/E27.006; 365/158, 171–173
See application file for complete search history.

(56) References Cited

U.S. PATENT DOCUMENTS

| | | | |
|---|---|---|---|
| 6,807,034 B2 | 10/2004 | Hasegawa et al. | |
| 7,242,045 B2 | 7/2007 | Nguyen et al. | |
| 7,378,698 B2 | 5/2008 | Ha et al. | |
| 7,595,966 B2* | 9/2009 | Watanabe et al. | 360/324.12 |
| 7,907,440 B2 | 3/2011 | Worledge | |
| 7,985,994 B2 | 7/2011 | Zheng et al. | |
| 2010/0277976 A1 | 11/2010 | Oh et al. | |
| 2011/0031569 A1* | 2/2011 | Watts et al. | 257/421 |
| 2011/0141803 A1 | 6/2011 | Kim et al. | |
| 2012/0018823 A1 | 1/2012 | Huai et al. | |
| 2012/0170357 A1* | 7/2012 | Apalkov et al. | 365/158 |

FOREIGN PATENT DOCUMENTS

| | | |
|---|---|---|
| JP | 2002151758 | 5/2002 |
| JP | 2011060918 | 3/2011 |

* cited by examiner

*Primary Examiner* — Allison P Bernstein
(74) *Attorney, Agent, or Firm* — Convergent Law Group LLP (57) ABSTRACT

A method and system provide a magnetic junction usable in a magnetic device. The magnetic junction includes a pinned layer, a nonmagnetic spacer layer, and a free layer. The nonmagnetic spacer layer is between the pinned layer and the free layer. The free layer has a gradient in a critical switching current density ($J_{c0}$) such that a first $J_{c0}$ of a first portion of the free layer is lower than a second $J_{c0}$ of a second portion of the free layer. The second portion of the free layer is further from the nonmagnetic spacer layer than the first portion is. The magnetic junction is configured such that the free layer is switchable between a plurality of stable magnetic states when a write current is passed through the magnetic junction.

44 Claims, 7 Drawing Sheets

METHOD AND SYSTEM FOR PROVIDING MAGNETIC JUNCTIONS HAVING A GRADED MAGNETIC FREE LAYER

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

Figure 1:
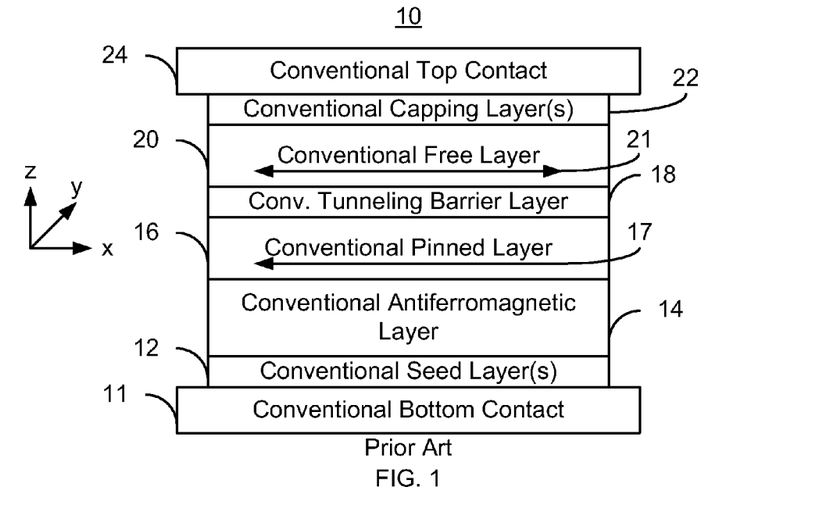
FIG. 1 depicts a conventional magnetic junction.

For example, FIG. 1 depicts a conventional magnetic tunneling junction (MTJ) 10 as it may be used in a conventional STT-MRAM. The conventional MTJ 10 typically resides on a bottom contact 11, uses conventional seed layer(s) 12 and includes a conventional antiferromagnetic (AFM) layer 14, a conventional pinned layer 16, a conventional tunneling barrier layer 18, a conventional free layer 20, and a conventional capping layer 22. Also shown is top contact 24.

Conventional contacts 11 and 24 are used in driving the current in a current-perpendicular-to-plane (CPP) direction, or along the z-axis as shown in FIG. 1. The conventional seed layer(s) 12 are typically utilized to aid in the growth of subsequent layers, such as the AFM layer 14, having a desired crystal structure. The conventional tunneling barrier layer 18 is nonmagnetic and is, for example, a thin insulator such as MgO.

The conventional pinned layer 16 and the conventional free layer 20 are magnetic. The magnetization 17 of the conventional pinned layer 16 is fixed, or pinned, in a particular direction, typically by an exchange-bias interaction with the magnetization of AFM layer 14. Although depicted as a simple (single) layer, the conventional pinned layer 16 may include multiple layers. For example, the conventional pinned layer 16 may be a synthetic antiferromagnetic (SAF) layer including magnetic layers antiferromagnetically coupled through thin conductive layers, such as Ru. In such a SAF, multiple magnetic layers interleaved with a thin layer of Ru may be used. In another embodiment, the coupling across the Ru layers can be ferromagnetic. Further, other versions of the conventional MTJ 10 might include an additional pinned layer (not shown) separated from the free layer 20 by an additional nonmagnetic barrier or conductive layer (not shown).

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as in-plane, the magnetization 21 of the conventional free layer 20 may have a perpendicular anisotropy. Thus, the pinned layer 16 and free layer 20 may have their magnetizations 17 and 21, respectively oriented perpendicular to the plane of the layers.

To switch the magnetization 21 of the conventional free layer 20, a current is driven perpendicular to plane (in the z-direction). When a sufficient current is driven from the top contact 24 to the bottom contact 11, the magnetization 21 of the conventional free layer 20 may switch to be parallel to the magnetization 17 of the conventional pinned layer 16. When a sufficient current is driven from the bottom contact 11 to the top contact 24, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10. Thus, by reading the tunneling magnetoresistance (TMR) of the conventional MTJ 10 the state of the conventional MTJ can be determined.

Although the conventional MTJ 10 may be written using spin transfer, read by sensing the TMR of the junction, and used in an STT-MRAM, there are drawbacks. For example, the critical switching current density, $J_{c0}$, of the conventional free layer 20 may be significantly higher than desired. In some cases, the critical switching current density is on the order of three to five times higher than the desired critical switching current density. The critical switching current density is the current density (e.g. $MA/cm^2$) required to switch the magnetic moment 21 of the conventional free layer 20 using spin transfer. A low switching current is desired, for example, to reduce the power consumed during switching and/or to improve the switching speed or error rates. Although conventional mechanisms exist that reduce the switching current, these generally adversely affect thermal stability. A reduction in the thermal stability of the conventional MTJ 10 negatively impacts the ability of the conventional MTJ 10 to reliably store data over time. Thus, performance of the conventional MTJ suffers.

Accordingly, what is needed is a method and system that may improve the performance of the spin transfer torque based memories. The method and system described herein address such a need.

BRIEF SUMMARY OF THE INVENTION

A method and system provide a magnetic junction usable in a magnetic device. The magnetic junction includes a pinned layer, a nonmagnetic spacer layer, and a free layer. The nonmagnetic spacer layer is between the pinned layer and the free layer. The free layer has a gradient in a critical switching current density ($J_{c0}$) such that a first $J_{c0}$ of a first portion of the free layer is lower than a second $J_{c0}$ of a second portion of the free layer. The second portion of the free layer is further from the nonmagnetic spacer layer than the first portion is. The magnetic junction is configured such that the free layer is switchable between a plurality of stable magnetic states when a write current is passed through the magnetic junction.

DETAILED DESCRIPTION OF THE INVENTION

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Methods and systems provide a magnetic junction as well as a magnetic memory utilizing the magnetic junction. The magnetic junction includes a pinned layer, a nonmagnetic spacer layer, and a free layer. The nonmagnetic spacer layer is between the pinned layer and the free layer. The free layer has a gradient in a critical switching current density ($J_{c0}$) such that a first $J_{c0}$ of a first portion of the free layer is lower than a second $J_{c0}$ of a second portion of the free layer. The second portion of the free layer is further from the nonmagnetic spacer layer than the first portion is. The magnetic junction is configured such that the free layer is switchable between a plurality of stable magnetic states when a write current is passed through the magnetic junction.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomenon. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or free layers having particular layers. However, one of ordinary skill in the art will readily recognize that magnetic junctions and/or free layers having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and free layers. However, one of ordinary skill in the art will readily recognize that the method and system are consistent with the use of magnetic memories having multiple magnetic junctions and using multiple free layers. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 2:
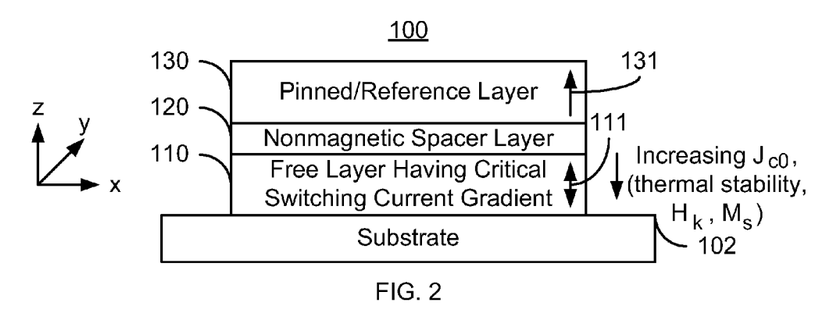
FIG. 2 depicts an exemplary embodiment of a magnetic junction including a free layer having a gradient in the critical switching current density and switchable using spin transfer.

FIG. 2 depicts an exemplary embodiment of a magnetic junction 100 including a free layer having a gradient in the critical switching current density and switchable using spin transfer. The magnetic junction may be, for example a magnetic tunneling junction (MTJ), spin valve, or ballistic magnetoresistance structure, or some combination thereof. The magnetic junction 100 may be used in a variety of applications. For example, the magnetic junction may be used in a magnetic memory such as an STT-MRAM. For clarity, FIG. 2 is not to scale. The magnetic junction includes a free layer 110, a nonmagnetic spacer layer 120 and a pinned or reference layer 130. The magnetic junction 100 is shown as residing on a substrate 102. In some embodiments, the magnetic junction 100 may include seed layer(s) and/or capping layer (s) (not shown). Although layers 110, 120, and 130 are shown with a particular orientation, this orientation may vary in other embodiments. For example, the pinned layer 130 may be closer to the bottom (closest to the substrate 102) of the magnetic junction 100. A pinning layer (not shown) may also be used. In general, the pinning layer would be used if the magnetic moment of the pinned layer 130 is in plane but would not be used if the magnetic moment of the pinned layer 130 is perpendicular to plane, as shown. Such a pinning layer may be used to fix the magnetization 131 of the pinned layer 130. In some embodiments, the pinning layer may be an AFM layer or multilayer that pins the magnetization (not shown) of the pinned layer 130 by an exchange-bias interaction. The magnetic junction 100 is also configured to allow the free layer 110 to be switched between stable magnetic states when a write current is passed through the magnetic junction 100. Thus, the magnetic moment 111 of the free layer 110 is switchable utilizing spin transfer torque. Because the magnetic moment 111 is switchable, the magnetic moment 111 is indicated by a dual headed arrow.

The nonmagnetic spacer layer 120 may be a tunneling barrier layer, conductor, or other structure for which magnetoresistance is exhibited between the free layer 110 and the pinned layer 130. In some embodiments, the nonmagnetic spacer layer 120 is a crystalline MgO tunneling barrier layer. Such a nonmagnetic spacer layer may have a preferred crystallographic orientation, such as a (100) orientation.

Although depicted as simple layers, the free layer 110 and/or the pinned layer 130 may include multiple layers. For example, the free layer 110 and/or the pinned layer 130 may be a SAF including magnetic layers antiferromagnetically or ferromagnetically coupled through thin layers, such as Ru. In such a SAF, multiple magnetic layers interleaved with thin layer(s) of Ru or other material may be used. The free layer 110 and/or the pinned layer 130 may also be another multilayer.

The free layer 110 and/or the pinned layer 130 may each have a perpendicular anisotropy energy that exceeds the out-of-plane demagnetization energy. Thus, the free layer 110 and/or the pinned layer 130 may each have its magnetic moment 111 and/or 131, respectively, oriented perpendicular to plane at equilibrium as is shown in FIG. 2. Stated differently, the easy axes of the layer 110 and 130 are perpendicular to plane. The free layer magnetic moment 111 is switchable using spin transfer and thus is shown by a dual arrow 111. The magnetic moment 131 of the pinned layer 130 may be fixed in a particular direction. In the embodiment shown, the magnetic moment 131 of the pinned layer 130 is in the positive z-direction. In another embodiment, the magnetic moment 131 may be in the negative z direction. In other embodiments, the magnetic moment of the free layer 110 and/or the pinned layer 130 may be stable in another direction including but not limited to in-plane. Other orientations of the magnetic moments of the free layer 110 and/or the pinned layer 130 are possible.

The free layer 110 has a gradient in the critical switching current density, $J_{c0}$. More specifically, the critical switching current density is lower closer to the nonmagnetic spacer layer 120. Thus, a first $J_{c0}$ of a first portion of the free layer 110 is lower than a second $J_{c0}$ of a second portion of the free layer 110 if the second portion is further from the nonmagnetic spacer layer than the first portion. As the free layer 110 is traversed in a direction away from the nonmagnetic spacer layer 120 (i.e. in the negative z direction in FIG. 2), $J_{c0}$ increases. In some embodiments $J_{c0}$ increases monotonically. The change may be linear or may follow another curve. In some embodiments, $J_{c0}$ may remain constant for a particular portion of the free layer 110. However, $J_{c0}$ is not constant over the entire free layer 110. In some embodiments, there is also a gradient in the thermal stability of the free layer 110. Like $J_{c0}$, the thermal stability may also increase further from the nonmagnetic spacer layer 120'. In some embodiments, the thermal stability increases in the same manner as the $J_{c0}$. However, in other embodiments, the thermal stability may vary in another manner.

The gradient in $J_{c0}$ within the free layer 110 may be achieved in a number of ways. For example, the $J_{c0}$ varies with the magnetic anisotropy, $H_k$, and the saturation magnetization, $M_s$. In some embodiments, the magnetic anisotropy, such as the perpendicular magnetic anisotropy, may increase with increasing distance from the nonmagnetic spacer layer 120. In other embodiments, the saturation magnetization may increase with increasing distance from the nonmagnetic spacer layer 120. In still other embodiments, these quantities may increase or decrease through the free layer 110. However, the combination is such that the desired gradient in $J_{c0}$ is established. For example, the magnetic anisotropy may decrease over some portion of the free layer 110 while the saturation magnetization may increase over the same portion. However the combination of these and other parameters are such that the switching current density increases with increasing distance from the nonmagnetic spacer layer.

The variation in $H_k$, $M_s$, and/or other properties that influence the critical switching current density may be achieved in a number of ways. In some embodiments, the free layer 110 may be an alloy having variations in concentrations in magnetic constituents such as Co and/or Fe. This gradient in concentration may be achieved in a number of ways. For example, the magnetic and other materials may be co-sputtered from multiple targets. By varying the sputtering rate from particular targets, the stoichiometry of the alloy may be changed. The gradient may also be achieved via atomic diffusion due to high temperature annealing after the free layer 110 has been deposited. The annealing may take place in situ or ex situ. Some combination of these and other techniques may be used. In other embodiments, the concentration of other materials including but not limited to dopants such as B may be tailored to achieve the desired gradient(s) in magnetic anisotropy and/or saturation magnetization.

In some embodiments, the free layer 110 may be a multilayer, including multiple magnetic layers. In some such embodiments, the magnetic layers may be interleaved with nonmagnetic layers. The nonmagnetic layers may be insulators such as MgO, conductors such as Pt or Pd, or some combination thereof. However, the magnetic layers are ferromagnetically coupled through the nonmagnetic layers. The magnetic layers are configured such that there is a gradient in $J_{c0}$ between the magnetic layers. Thus, a magnetic layer closer to the nonmagnetic spacer layer 120 has a lower $J_{c0}$ than another layer further from the nonmagnetic spacer layer. This gradient in $J_{c0}$ between the magnetic layers may be achieved by one or more of judicious selection of magnetic and/or nonmagnetic materials, variations in thickness of the magnetic layers, varying the thickness of the nonmagnetic layers, and some other analogous mechanism.

The magnetic junction 100 may have improved performance. Because of the gradient in $J_{c0}$, the overall switching current for the free layer 110 may be reduced. In some embodiments, the total critical switching current density may be $1\times10^6$ A/cm$^2$. The portion of the free layer 110 (e.g. magnetic layers) near the nonmagnetic spacer layer 120 may be easily switchable by itself. In some embodiments, this portion of the free layer 110 is not thermally stable. The next magnetic portion of the free layer 110 may have a higher switching current and be more thermally stable. The portion of the free layer 110 furthest from the nonmagnetic spacer layer 120 may be the most thermally stable and may have the highest $J_{c0}$. Because magnetic portions of the free layer 110 further from the nonmagnetic spacer layer 120 are thermally stable and ferromagnetically coupled with portions of the free layer 110 closer to the nonmagnetic spacer layer 120, the free layer 110 is thermally stable as a whole. Because magnetic portions of the free layer 110 closer to the nonmagnetic spacer layer 120 have a lower $J_{c0}$ and are ferromagnetically coupled with other portions of the free layer 110, the free layer as a whole switches at a lower $J_{c0}$. Thus, thermal stability and lower $J_{c0}$ may be achieved. Thus, the performance of the magnetic junction 100 may improve.

Figure 3:
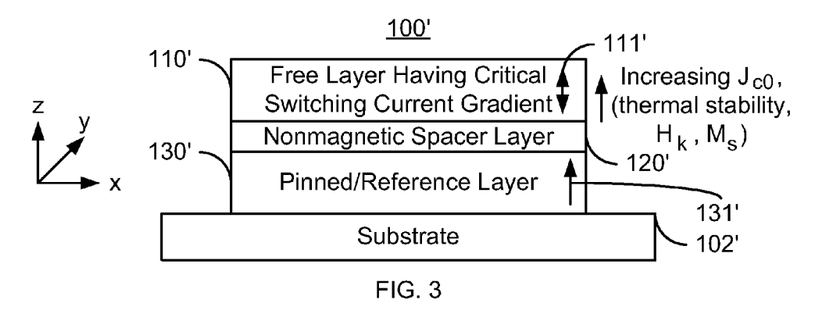
FIG. 3 depicts another exemplary embodiment of a magnetic junction including a free layer having a gradient in the critical switching current density and switchable using spin transfer.

FIG. 3 depicts another exemplary embodiment of a magnetic junction 100' including a free layer 110' having a gradient in the critical switching current density and switchable using spin transfer. For clarity, FIG. 3 is not to scale. The magnetic junction 100' is analogous to the magnetic junction 100. Thus, analogous layers are labeled similarly. The magnetic junction 100' includes a free layer 110', a nonmagnetic spacer layer 120', and a pinned layer 130' analogous to the layers 110, 120, and 130, respectively. Although layers 110', 120', and 130' are shown with a particular orientation, this orientation may vary in other embodiments. In some embodiments, an optional seed layer (not shown), an optional pinning layer (not shown) and/or optional capping layer (not shown) may be included. The magnetic junction 100' is also configured to allow the magnetization of the free layer 110' to be switched between stable magnetic states when a write current is passed through the magnetic junction 100'. Thus, the magnetization of the free layer 110' is switchable utilizing spin transfer torque.

In the magnetic junction 100', the pinned layer 130' is closer to the substrate 102' than the free layer 110'. The free layer 110' has a gradient in the critical switching current density analogous to that of the free layer 110. The critical switching current density of the free layer 110' is lower closer to the nonmagnetic spacer layer 120'. Thus, a first $J_{c0}$ of a first portion of the free layer 110' is lower than a second $J_{c0}$ of a second portion of the free layer 110' if the second portion is further from the nonmagnetic spacer layer than the first portion. However, because the orientation of the pinned layer 130' and free layer 110' with respect to the substrate has changed, as the free layer 110 in the positive z direction in FIG. 3 (still in a direction away from the nonmagnetic spacer layer 120'), $J_{c0}$ increases. In some embodiments $J_{c0}$ increases monotonically. The change may be linear or may follow another curve. In some embodiments, $J_{c0}$ may remain constant for a particular portion of the free layer 110'. However, $J_{c0}$ is not constant over the entire free layer 110'. In some embodiments, there is also a gradient in the thermal stability of the free layer 110'. Like $J_{c0}$, the thermal stability may also increase further from the nonmagnetic spacer layer 120'. In some embodiments, the thermal stability increases in the same manner as the $J_{c0}$. However, in other embodiments, the thermal stability may vary in another manner.

The magnetic junction 100' may share the benefits of the magnetic junction 100. Because of the gradient in $J_{c0}$, ferromagnetic coupling between portions of the free layer 110', the overall switching current for the free layer 110' may be reduced. In some embodiments, the total critical switching current density may be $1\times10^6$ A/cm$^2$. Because magnetic portions of the free layer 110' further from the nonmagnetic spacer layer 120' are thermally stable and ferromagnetically coupled with portions of the free layer 110' closer to the nonmagnetic spacer layer 120', the free layer 110' is thermally stable as a whole. Thus, thermal stability and lower $J_{c0}$ may be achieved. The performance of the magnetic junction 100' may thus be improved.

Figure 4:
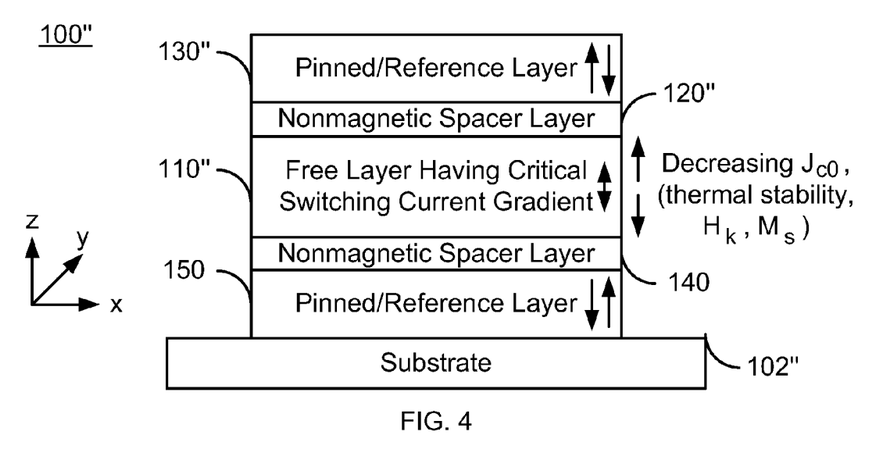
FIG. 4 depicts another exemplary embodiment of a magnetic junction including a free layer having a gradient in the critical switching current density and switchable using spin transfer.

FIG. 4 depicts another exemplary embodiment of a magnetic junction 100" including a free layer 110" having a gradient in the critical switching current density and switchable using spin transfer. For clarity, FIG. 4 is not to scale. The magnetic junction 100" is analogous to the magnetic junctions 100 and/or 100'. Thus, analogous layers are labeled similarly. The magnetic junction 100" includes a free layer 110", a nonmagnetic spacer layer 120", and a pinned layer 130" analogous to the layers 110/110', 120/120', and 130/130', respectively. In some embodiments, an optional seed layer (not shown), an optional pinning layer (not shown) and/or optional capping layer (not shown) may be included. The magnetic junction 100" is also configured to allow the free layer 110" to be switched between stable magnetic states when a write current is passed through the magnetic junction 100". Thus, the free layer 110" is switchable utilizing spin transfer torque.

In addition to the layers 110", 120" and 130", the magnetic junction 100" includes an additional nonmagnetic spacer layer 140 and an additional pinned layer 150. The magnetic junction 100" is, therefore, a dual magnetic junction. The nonmagnetic spacer layer 140 is analogous to the spacer layers 120, 120', and 120". The magnetic junction may, for example, be a dual MTJ or a dual spin valve. The pinned layer 150 is analogous to the pinned layers 130, 130', and 130".

The free layer 110" has a gradient in the critical switching current density analogous to that of the free layers 110 and 110'. However, the magnetic junction 100" has two nonmagnetic spacer layers 120" and 140. The critical switching current density of the free layer 110" is lower closer to the nonmagnetic spacer layers 120" and 140. Thus, the highest critical switching current density is at or near the middle of the free layer 110" in the z-direction. The critical switching current density falls off as the nonmagnetic spacer layers 120" and 140 are approached. In some embodiments $J_{c0}$ increases monotonically toward the center of the free layer 110" in at least the z direction. The change may be linear or may follow another curve. In some embodiments, $J_{c0}$ may remain constant for a particular portion of the free layer 110". However, $J_{c0}$ is not constant over the entire free layer 110". In some embodiments, there is also a gradient in the thermal stability of the free layer 110". Like $J_{c0}$, the thermal stability may also increase further from the nonmagnetic spacer layers 120" and 140. In some embodiments, the thermal stability increases in the same manner as the $J_{c0}$. However, in other embodiments, the thermal stability may vary in another manner.

The magnetic junction 100" may share the benefits of the magnetic junctions 100 and/or 100'. Because of the gradient in $J_{c0}$, ferromagnetic coupling between portions of the free layer 110", the overall switching current for the free layer 110" may be reduced. In some embodiments, the total critical switching current density may be $1\times10^6$ A/cm$^2$. Because magnetic portions of the free layer 110" further from the nonmagnetic spacer layers 120" and 140 are thermally stable and ferromagnetically coupled with portions of the free layer 110" closer to the nonmagnetic spacer layers 120" and 140, the free layer 110" is thermally stable as a whole. Thus, thermal stability and lower $J_{c0}$ may be achieved. The performance of the magnetic junction 100" may thus be improved.

Figure 5:
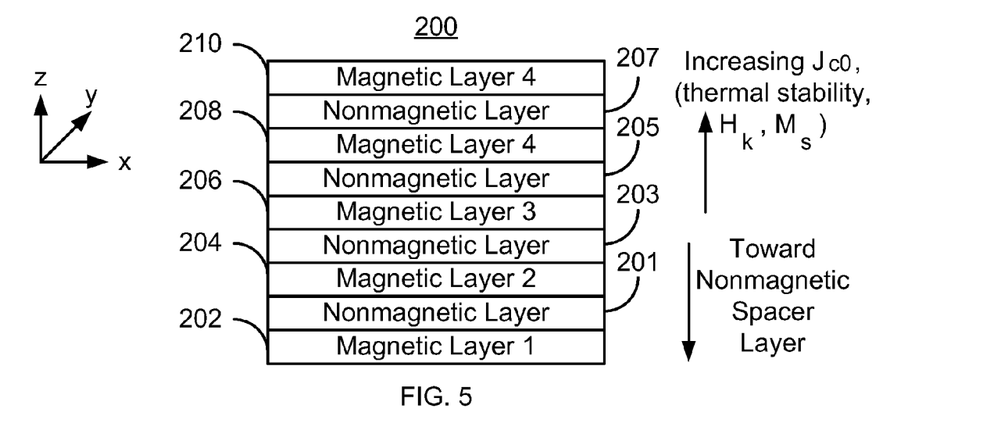
FIG. 5 depicts an exemplary embodiment of a free layer having a gradient in the critical switching current density and switchable using spin transfer.

As discussed above, a free layer 110, 110', and/or 110" having a desired gradient in critical switching current density may be achieved in a number of ways. FIGS. 5 and 7-13 depict embodiments of various such mechanisms. FIG. 5 depicts an exemplary embodiment of a free layer 200 having a gradient in the critical switching current density, switchable using spin transfer, and including multiple layers. The free layer 200 may be used in one or more of the free layers 110, 110', and 110". The free layer 200 includes magnetic layers 202, 204, 206, 208, and 210 interleaved with nonmagnetic layers 201, 203, 205 and 207. The magnetic layers 202, 204, 206, 208 and 210 may thus include Co, Fe, and/or Ni. Although five magnetic layers 202, 204, 206, 208 and 210 and four nonmagnetic layers 201, 203, 205 and 207 are shown, another number of magnetic and/or nonmagnetic layers may be used. As discussed above, the magnetic layers 202, 204, 206, 208 and 210 may be configured such that the magnetic anisotropy $H_k$ increases from layers 202 through 210, such that the saturation magnetization $M_s$ increases from layers 202 through 210, or some combination of $H_k$ and $M_s$ increases from layers 202 through 210. As a result, the critical switching current density increases from layers 202 through 210. The critical switching current density thus increases with increasing distance from the nonmagnetic spacer layer (not shown in FIG. 5). Similarly, the thermal stability of the magnetic layers 202, 204, 206, 208 and 210 may increase with increasing distance from the nonmagnetic spacer layer. Further, no particular relationship to the substrate (not shown) is assumed for FIG. 5.

Figure 6:
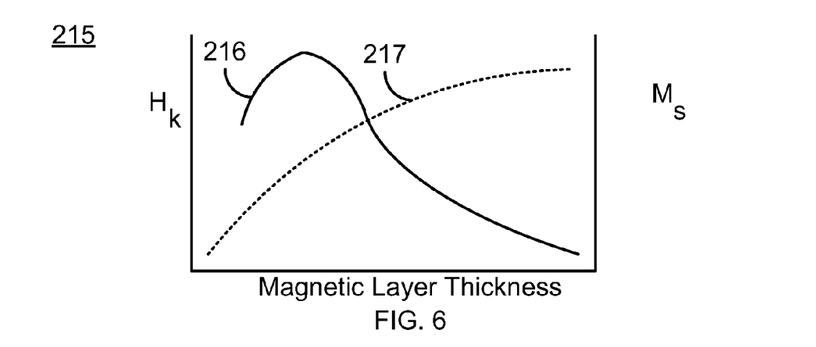
FIG. 6 depicts a phase diagram indicating the variation of the properties of a magnetic material with the thickness of the layer and switchable using spin transfer.

FIG. 6 depicts a phase diagram 215 indicating an example of the variation of the properties of a magnetic material with the thickness of the layer. Referring to FIGS. 5-6, the curve 216 indicates the magnetic anisotropy, $H_k$, while the curve 217 indicates the variation in saturation magnetization $M_s$. Both $M_s$ and $H_k$ vary with magnetic layer thickness. The thicknesses of the layers 202, 204, 206, 208 and 210 of magnetic material within the free layer 200 may be selected such that the combination of $H_k$ and $M_s$ results in layers closer to the nonmagnetic spacer layer having a higher Jc0 than layers further from the nonmagnetic spacer layer. Thus, in some embodiments, the gradient in critical switching current density may be provided by varying the thicknesses of the layers 202, 204, 206, 208 and 210 and/or the thicknesses of the layers 201, 203, 205 and 207.

In other embodiments, the material(s) used for the layers 201, 202, 203, 204, 205, 206, 207, 208 and 210 may be varied. For example, the layer 202 may include CoFeB with a B doping concentration of not more than thirty percent, while the layers 204, 206, 208 and 210 may include other magnetic materials such as CoX, and FeX. In some embodiments the composition of B can vary within a thickness of a layer. In some embodiments, the concentration of B dopant in CoFeB is not more than ten percent. For an enhanced perpendicular magnetic anisotropy, the Co or Fe layers may be interleaved with Pt and/or Pd nonmagnetic layers 201, 203, 205 and 207. In some such embodiments, the thicknesses of the nonmagnetic layers 201, 203, 205, and 207 may be at least two Angstroms. However, the thickness(es) of the nonmagnetic insulating layers may be desired to be not more than 1.5 nm. In some such embodiments, the thicknesses of the nonmagnetic insulating layers are desired to be not more than 1 nm. In some embodiments, insulating layers such as MgO may be used for the nonmagnetic layers 201, 203, 205, and 207. In such embodiments, the perpendicular magnetic anisotropy of the layers 202, 204, 206, 208 and/or 210 may also be enhanced. However, the thicknesses of the insulating nonmagnetic layers 201, 203, 205 and 207 may be thinner in order to maintain the exchange coupling between the layers 202, 204, 206, 208 and 210. For example, the insulating nonmagnetic layers 201, 203, 205 and 207 may be not more than eight Angstroms thick. However other thicknesses are possible. If MgO is used for the insulating layers 201, 203, 205 and 207, the MgO layers 201, 203, 205 and 207 may each be at least four and not more than fourteen Angstroms thick. In other embodiments, combinations of variations in material(s) and thicknesses of the layers 201, 202, 203, 204, 205, 206, 207, 208, and 210 may be used. For example, the nonmagnetic layers 201, 203, 205 and 207 may include radio-frequency (RF) deposited MgO, MgO with NOX or hybrid MgO layers that include Mg, Mg NOX and RF MgO. In such embodiments, X may be one or more of B, P, Si, Zr, Hf, Ta, Ti, Bi, Mg, Cr, Ru, Ge, Os, W, Rh, Ir, Zn, V, Nb, Mo, and Rb. Alternatively, changes in other parameters in the layers 201, 202, 203, 204, 205, 206, 207, 208, and 210 may be employed to obtain the desired gradient in critical switching current density.

Figure 7:
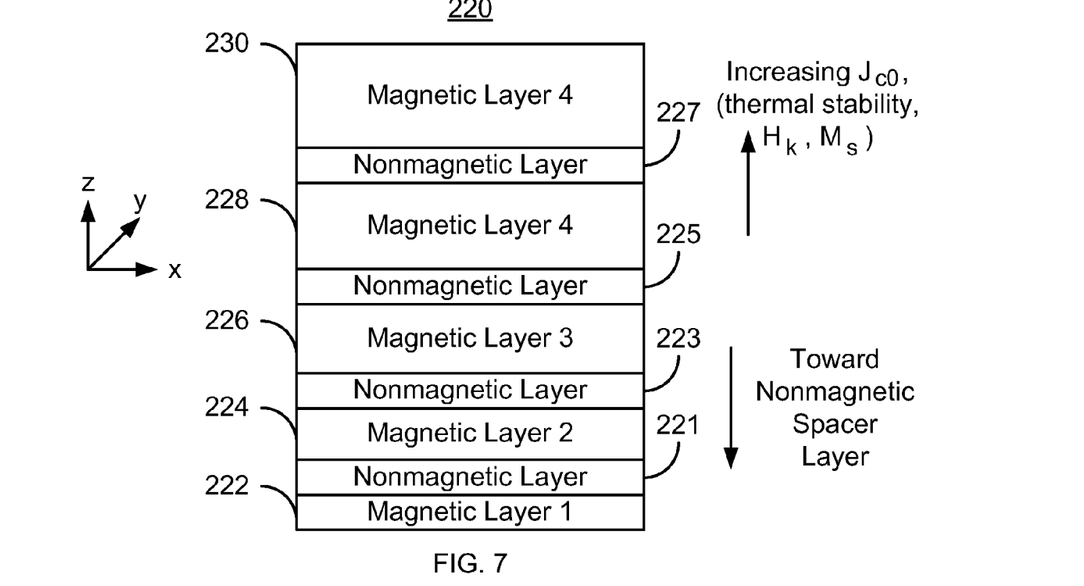
FIG. 7 depicts another exemplary embodiment of a free layer having a gradient in the critical switching current density and switchable using spin transfer.

For example, FIG. 7 depicts an exemplary embodiment of a free layer 220 having a gradient in the critical switching current density, switchable using spin transfer, and including multiple layers. The free layer 220 may be used in one or more of the free layers 110, 110', 110" and 200. The free layer 220 includes magnetic layers 222, 224, 226, 228, and 230 interleaved with nonmagnetic layers 221, 223, 225 and 227. Although five magnetic layers 222, 224, 226, 228 and 230 and four nonmagnetic layers 221, 223, 225 and 227 are shown, another number of magnetic and/or nonmagnetic layers may be used. The layers 221, 222, 223, 224, 225, 226, 227, 228 and 230 are analogous to the layers 201, 202, 203, 204, 205, 206, 207, 208 and 210, respectively. Further, no particular relationship to the substrate (not shown) is assumed for FIG. 7.

In the embodiment shown in FIG. 7, the thicknesses of the magnetic layers 222, 224, 226, 228 and 230 increase with increasing distance from the nonmagnetic spacer layer (not shown in FIG. 7). In some embodiments, the material(s) used in the layers 221, 222, 223, 224, 225, 226, 227, 228 and/or 230 may also vary. The thickness of the nonmagnetic layers 221, 223, 225 and 227 is kept substantially constant. The values of the thicknesses and the magnetic material(s) for the magnetic layers 222, 224, 226, 228 and 230 are selected such that thicker layers have a higher critical switching current (e.g. a higher perpendicular anisotropy and/or a higher saturation magnetization). In addition, the thicker layers may have greater thermal stability. As a result, the critical switching current density increases from layers 222 through 230 such that the critical switching current density increases with increasing distance from the nonmagnetic spacer layer (not shown in FIG. 7). Similarly, the thermal stability of the magnetic layers 222, 224, 226, 228 and 230 may increase with increasing distance from the nonmagnetic spacer layer. It is also noted that the perpendicular magnetic anisotropy of the free layer 220 may be greater than the out-of-plane demagnetization energy. As such, the magnetic moment of the free layer 220 may be perpendicular to plane (i.e. substantially along the z axis).

Figure 8:
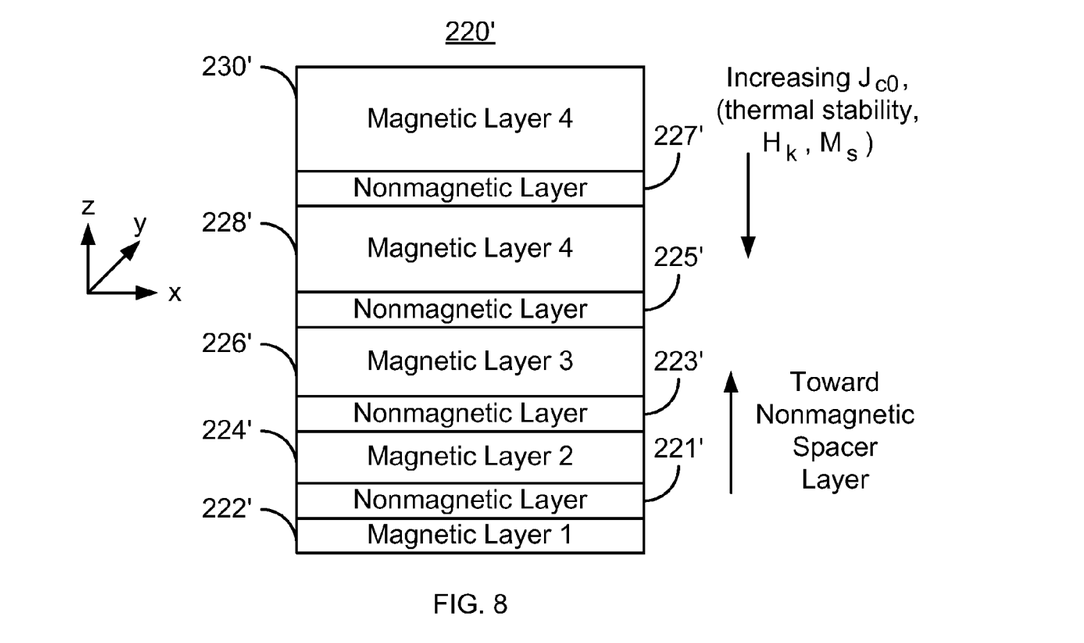
FIG. 8 depicts another exemplary embodiment of a free layer having a gradient in the critical switching current density and switchable using spin transfer.

FIG. 8 depicts an exemplary embodiment of a free layer 220' having a gradient in the critical switching current density, switchable using spin transfer, and including multiple layers. The free layer 220' is analogous to and may be used in one or more of the free layers 110, 110', 110", 200 and 220. The free layer 220' includes magnetic layers 222', 224', 226', 228', and 230' interleaved with nonmagnetic layers 221', 223', 225' and 227'. Although five magnetic layers 222', 224', 226', 228' and 230' and four nonmagnetic layers 221', 223', 225' and 227' are shown, another number of magnetic and/or nonmagnetic layers may be used. The layers 221', 222', 223', 224', 225', 226', 227', 228' and 230' are analogous to the layers 201/221, 202/222, 203/223, 204/224, 205/225, 206/226, 207/227, 208/228 and 210/230, respectively. Further, no particular relationship to the substrate (not shown) is assumed for FIG. 8.

In the embodiment shown in FIG. 8, the thicknesses of the magnetic layers 222', 224', 226', 228' and 230' decrease with increasing distance from the nonmagnetic spacer layer (not shown in FIG. 8). In some embodiments, the material(s) used in the layers 221', 222', 223', 224', 225', 226', 227', 228' and/or 230' may also vary. The thickness of the nonmagnetic layers 221', 223', 225' and 227' is kept substantially constant. The values of the thicknesses and the magnetic material(s) for the magnetic layers 222', 224', 226', 228' and 230' are selected such that thinner layers have a higher critical switching current (e.g. a higher perpendicular anisotropy and/or a higher saturation magnetization). In addition, the thinner layers may have greater thermal stability. As a result, the critical switching current density decreases from layers 222' through 230' such that the critical switching current density increases with increasing distance from the nonmagnetic spacer layer (not shown in FIG. 8). Similarly, the thermal stability of the magnetic layers 222', 224', 226', 228' and 230' may increase with increasing distance from the nonmagnetic spacer layer. It is also noted that the perpendicular magnetic anisotropy of the free layer 220' may be greater than the out-of-plane demagnetization energy. As such, the magnetic moment of the free layer 220' may be perpendicular to plane (i.e. substantially along the z axis).

Figure 9:
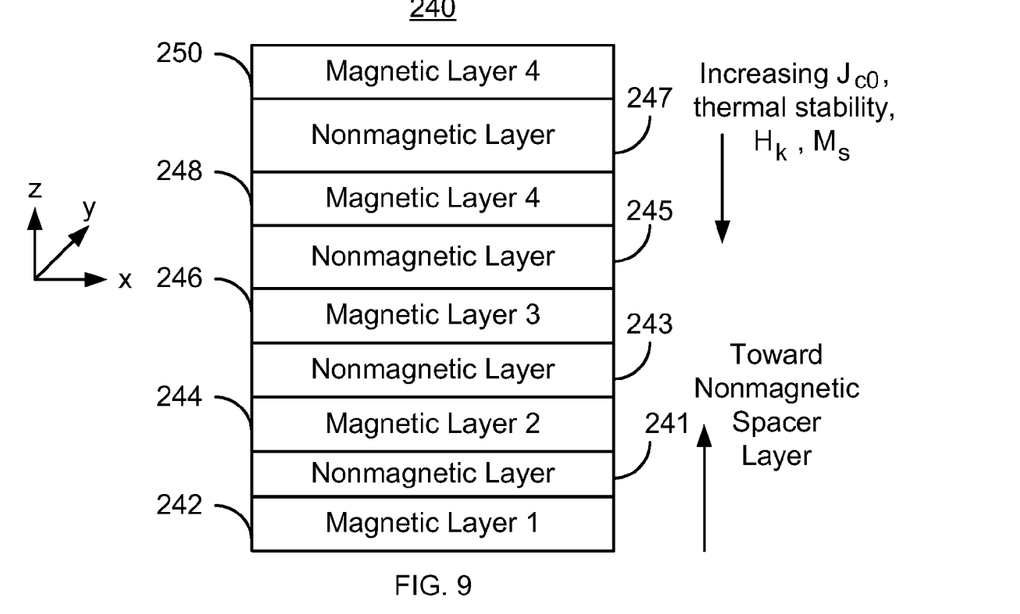
FIG. 9 depicts another exemplary embodiment of a free layer having a gradient in the critical switching current density and switchable using spin transfer.

FIG. 9 depicts an exemplary embodiment of a free layer 240 having a gradient in the critical switching current density, switchable using spin transfer, and including multiple layers. The free layer 240 is analogous to and may be used in one or more of the free layers 110, 110', 110", 200, 220 and 220'. The free layer 240 includes magnetic layers 242, 244, 246, 248, and 250 interleaved with nonmagnetic layers 241, 243, 245 and 247. Although five magnetic layers 242, 244, 246, 248 and 250 and four nonmagnetic layers 241, 243, 245 and 247 are shown, another number of magnetic and/or nonmagnetic layers may be used. The layers 241, 242, 243, 244, 245, 246, 247, 248 and 250 are analogous to the layers 201/221/221', 202//222/222', 203/223/223', 204/224/224', 205/225/225', 206/226/226', 207/227/227', 208/228/228' and 210/230/230', respectively. Further, no particular relationship to the substrate (not shown) is assumed for FIG. 9.

In the embodiment shown in FIG. 9, the thicknesses of the nonmagnetic layers 241, 243, 245 and 247 decreases with increasing distance from the nonmagnetic spacer layer (not shown in FIG. 9). In other embodiments, the thicknesses of the layers 241, 243, 245 and 247 may vary in another manner. In some embodiments, the material(s) used in the layers 241, 242, 243, 244, 245, 246, 247, 248 and/or 250 may also vary. The thickness of the magnetic layers 242, 244, 246, 248 and 250 is kept substantially constant. Because of the variation in thickness of the nonmagnetic layers 241, 243, 245 and 247, the magnetic coupling between the layers 242, 244, 24, 248 and 250 may change throughout the free layer 240. As a result, the critical switching current density decreases from layers 242 through 250 such that the critical switching current density increases with increasing distance from the nonmagnetic spacer layer (not shown in FIG. 9). Similarly, the thermal stability of the magnetic layers 242, 244, 246, 248 and 250 may increase with increasing distance from the nonmagnetic spacer layer. It is also noted that the perpendicular magnetic anisotropy of the free layer 240 may be greater than the out-of-plane demagnetization energy. As such, the magnetic moment of the free layer 240 may be perpendicular to plane (i.e. substantially along the z axis).

Figure 10:
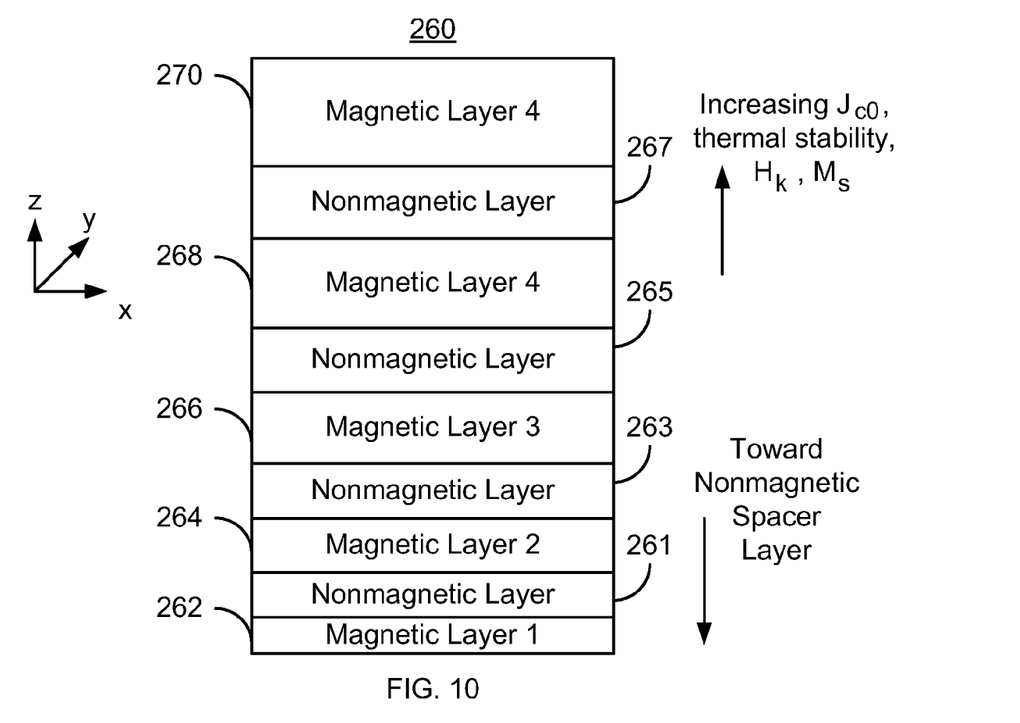
FIG. 10 depicts another exemplary embodiment of a free layer having a gradient in the critical switching current density and switchable using spin transfer.

FIG. 10 depicts an exemplary embodiment of a free layer 260 having a gradient in the critical switching current density, switchable using spin transfer, and including multiple layers. The free layer 260 is analogous to and may be used in one or more of the free layers 110, 110', 110", 200, 220, 220' and 240. The free layer 260 includes magnetic layers 262, 264, 266, 268, and 270 interleaved with nonmagnetic layers 261, 263, 265 and 267. Although five magnetic layers 262, 264, 266, 268 and 270 and four nonmagnetic layers 261, 263, 265 and 267 are shown, another number of magnetic and/or nonmagnetic layers may be used. The layers 261, 262, 263, 264, 265, 266, 267, 268 and 270 are analogous to the layers 201/221/221'/241, 202//222/222'/242, 203/223/223'/243, 204/224/224'/244, 205/225/225'/245, 206/226/226'/246, 207/227/227'/247, 208/228/228'/248 and 210/230/230'/250, respectively. Further, no particular relationship to the substrate (not shown) is assumed for FIG. 10.

In the embodiment shown in FIG. 10, the thicknesses of the nonmagnetic layers 261, 263, 265 and 267 increases with increasing distance from the nonmagnetic spacer layer (not shown in FIG. 10). In addition, the thicknesses of the magnetic layers 262, 264, 266, 268 and 270 also vary with distance from the nonmagnetic spacer layer. In other embodiments, the thicknesses of the layers 261, 262, 263, 264, 265, 266, 267, 268 and/or 270 may vary in another manner. In some embodiments, the material(s) used in the layers 261, 262, 263, 264, 265, 266, 267, 268 and/or 270 may also vary. Because of the variation in thickness of the layers 261, 262, 263, 264, 265, 266, 267, 268 and/or 270, the magnetic coupling, magnetic anisotropy, and/or saturation magnetization may change throughout the free layer 260. As a result, the critical switching current density increases from layers 262 through 270 such that the critical switching current density increases with increasing distance from the nonmagnetic spacer layer (not shown in FIG. 10). Similarly, the thermal stability of the magnetic layers 262, 264, 266, 268 and 270 may increase with increasing distance from the nonmagnetic spacer layer. It is also noted that the perpendicular magnetic anisotropy of the free layer 260 may be greater than the out-of-plane demagnetization energy. As such, the magnetic moment of the free layer 260 may be perpendicular to plane (i.e. substantially along the z axis).

Figure 11:
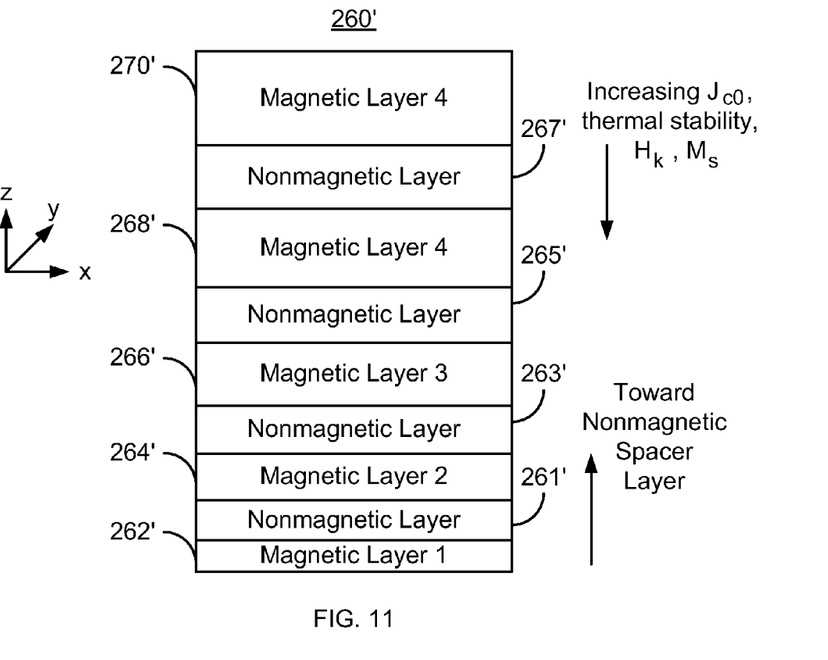
FIG. 11 depicts another exemplary embodiment of a free layer having a gradient in the critical switching current density and switchable using spin transfer.

FIG. 11 depicts an exemplary embodiment of a free layer 260' having a gradient in the critical switching current density, switchable using spin transfer, and including multiple layers. The free layer 260' is analogous to and may be used in one or more of the free layers 110, 110', 110", 200, 220, 220', 240, and 260. The free layer 260' includes magnetic layers 262', 264', 266', 268', and 270' interleaved with nonmagnetic layers 261', 263', 265' and 267'. Although five magnetic layers 262', 264', 266', 268' and 270' and four nonmagnetic layers 261', 263', 265' and 267' are shown, another number of magnetic and/or nonmagnetic layers may be used. The layers 261', 262', 263', 264', 265', 266', 267', 268' and 270' are analogous to the layers 201/221/221'/241/261, 202//222/222'/242/262, 203/223/223'/243/263, 204/224/224'/244/264, 205/225/225'/245/265, 206/226/226'/246/266, 207/227/227'/247/267, 208/228/228'/248/268 and 210/230/230'/250/270, respectively. Further, no particular relationship to the substrate (not shown) is assumed for FIG. 11.

In the embodiment shown in FIG. 11, the thicknesses of the magnetic layers 262', 264', 266', 268' and 270' decreases with increasing distance from the nonmagnetic spacer layer (not shown in FIG. 11). In addition, the thicknesses of the nonmagnetic layers 261', 263', 265' and 267' also vary with distance from the nonmagnetic spacer layer. In other embodiments, the thicknesses of the layers 261', 262', 263', 264', 265', 266', 267', 268' and/or 270' may vary in another manner. In some embodiments, the material(s) used in the layers 261', 262', 263', 264', 265', 266', 267', 268' and/or 270' may also vary. Because of the variation in thickness of the layers 261', 262', 263', 264', 265', 266', 267', 268' and/or 270', the magnetic coupling, magnetic anisotropy, and/or saturation magnetization may change throughout the free layer 260'. As a result, the critical switching current density decreases from layers 262' through 270' such that the critical switching current density increases with increasing distance from the nonmagnetic spacer layer (not shown in FIG. 11). Similarly, the thermal stability of the magnetic layers 262', 264', 266', 268' and 270' may increase with increasing distance from the nonmagnetic spacer layer. It is also noted that the perpendicular magnetic anisotropy of the free layer 260' may be greater than the out-of-plane demagnetization energy. As such, the magnetic moment of the free layer 260' may be perpendicular to plane (i.e. substantially along the z axis).

Figure 12:
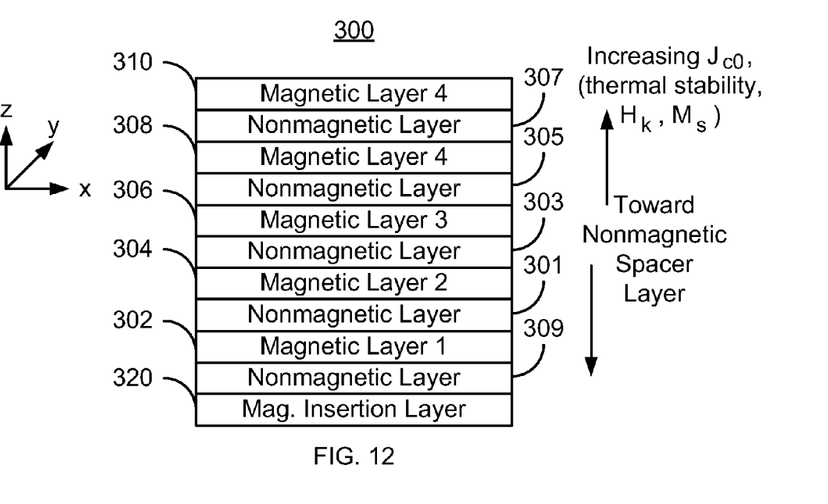
FIG. 12 depicts another exemplary embodiment of a free layer having a gradient in the critical switching current density and switchable using spin transfer.

FIG. 12 depicts an exemplary embodiment of a free layer 300 having a gradient in the critical switching current density, switchable using spin transfer, and including multiple layers. However, no particular relationship to the substrate (not shown) is assumed for FIG. 12. The free layer 300 is analogous to and may be used in one or more of the free layers 110, 110', 110'', 200, 220, 220', 240, 260 and 260'. The free layer 300 includes magnetic layers 302, 304, 306, 308, and 310 interleaved with nonmagnetic layers 301, 303, 305 and 307. Although five magnetic layers 302, 304, 306, 308, and 310 and four nonmagnetic layers 301, 303, 305 and 307 are shown, another number of magnetic and/or nonmagnetic layers may be used. The layers 301, 302, 303, 304, 305, 306, 307, 308 and 310 are analogous to the layers 201/221/221'/241/261/261', 202//222/222'/242/262/262', 203/223/223'/243/263/263', 204/224/224'/244/264/264', 205/225/225'/245/265/265', 206/226/226'/246/266/266', 207/227/227'/247/267/267', 208/228/228'/248/268/268' and 210/230/230'/250/270/270', respectively. In the embodiment shown, in FIG. 12, the thickness of the layers 301, 302, 303, 304, 305, 306, 307, 308 and 310 may be varied in a manner discussed above. In addition, the material(s) used in the layers 301, 302, 303, 304, 350, 306, 307, 308 and 310 may also be tailored to achieve the desired gradient in critical switching current density and other properties. It is also noted that the perpendicular magnetic anisotropy of the free layer 300 may be greater than the out-of-plane demagnetization energy. As such, the magnetic moment of the free layer 300 may be perpendicular to plane (i.e. substantially along the z axis).

In addition, the free layer 300 includes a magnetic insertion layer 320. This magnetic insertion layer 320 adjoins the nonmagnetic spacer layer (not shown in FIG. 12). In other embodiments, the magnetic insertion layer 320 may be located elsewhere in the free layer 300. Additional magnetic insertion layer(s) (not shown) might also be used. The free layer 300 also includes nonmagnetic layer 309 that is between the closest magnetic layers 302 and the magnetic insertion layer 320. The magnetic insertion layer 320 shown may have an enhanced spin polarization greater than the remaining magnetic layers 302, 304, 306, 308 and 310. For example, the magnetic insertion layer 320 may include CoFeB with not more than thirty atomic percent B. In some embodiments, the concentration of B dopant in CoFeB is not more than ten percent. In other embodiments, the magnetic insertion layer 320 may consist of Co or Fe.

In the embodiment shown in FIG. 12, the critical switching current density increases with increasing distance from the nonmagnetic spacer layer (not shown in FIG. 12). Similarly, the thermal stability of the free layer 300 may increase with increasing distance from the nonmagnetic spacer layer. Further, the free layer 300 may exhibit enhanced switching characteristics and/or enhanced tunneling magnetoresistance due to the presence of the magnetic insertion layer 320 having a high spin polarization.

Figure 13:
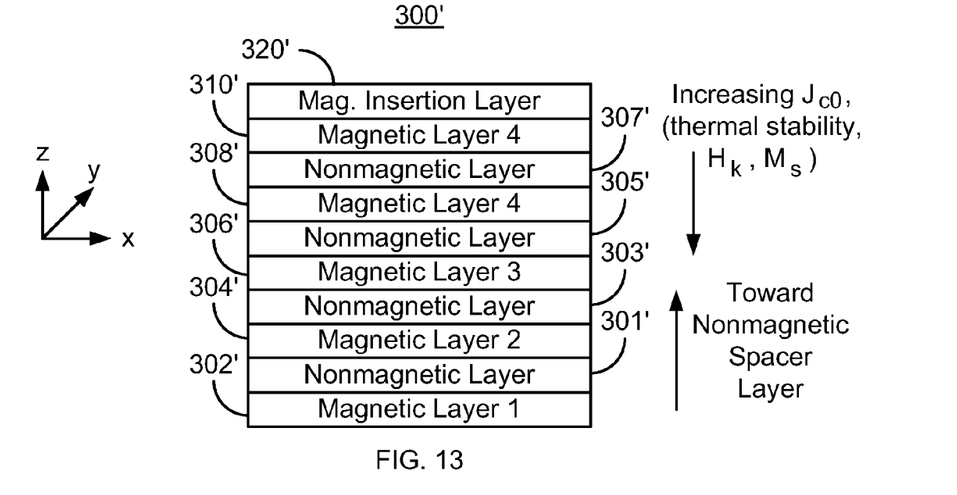
FIG. 13 depicts another exemplary embodiment of a free layer having a gradient in the critical switching current density and switchable using spin transfer.

FIG. 13 depicts an exemplary embodiment of a free layer 300' having a gradient in the critical switching current density, switchable using spin transfer, and including multiple layers. However, no particular relationship to the substrate (not shown) is assumed for FIG. 13. The free layer 300' is analogous to and may be used in one or more of the free layers 110, 110', 110'', 200, 220, 220', 240, 260, 260' and 300. The free layer 300' includes magnetic layers 302', 304', 306', 308', and 310' interleaved with nonmagnetic layers 301', 303', 305' and 307'. Although five magnetic layers 302', 304', 306', 308', and 310' and four nonmagnetic layers 301', 303', 305' and 307' are shown, another number of magnetic and/or nonmagnetic layers may be used. The layers 301', 302', 303', 304', 305', 306', 307', 308' and 310' are analogous to the layers 201/221/221'/241/261/261'/301, 202//222/222'/242/262/262'/302, 203/223/223'/243/263/263'/303, 204/224/224'/244/264/264'/304, 205/225/225'/245/265/265'/305, 206/226/226'/246/266/266'/306, 207/227/227'/247/267/267'/307, 208/228/228'/248/268/268'/308 and 210/230/230'/250/270/270'/310, respectively. In the embodiment shown, in FIG. 13, the thickness of the layers 301', 302', 303', 304', 305', 306', 307', 308' and 310' may be varied in a manner discussed above. In addition, the material(s) used in the layers 301', 302', 303', 304', 350', 306', 307', 308' and 310' may also be tailored to achieve the desired gradient in critical switching current density and other properties. It is also noted that the perpendicular magnetic anisotropy of the free layer 300' may be greater than the out-of-plane demagnetization energy. As such, the magnetic moment of the free layer 300' may be perpendicular to plane (i.e. substantially along the z axis).

In addition, the free layer 300' includes a magnetic insertion layer 320' analogous to the magnetic insertion layer 320. This magnetic insertion layer 320' adjoins the nonmagnetic spacer layer (not shown in FIG. 13). In other embodiments, the magnetic insertion layer 320' may be located elsewhere in the free layer 300'. Additional magnetic insertion layer(s) (not shown) might also be used. The magnetic insertion layer 320' shown may have an enhanced spin polarization greater than the remaining magnetic layers 302', 304', 306', 308' and 310'. For example, the magnetic insertion layer 320' may include CoFeB with not more than ten atomic percent B. In other embodiments, the magnetic insertion layer 320' may consist of Co or Fe.

In the embodiment shown in FIG. 13, the critical switching current density increases with increasing distance from the nonmagnetic spacer layer (not shown in FIG. 13). Similarly, the thermal stability of the free layer 300' may increase with increasing distance from the nonmagnetic spacer layer. Further, the free layer 300' may exhibit enhanced switching characteristics and/or enhanced tunneling magnetoresistance due to the presence of the magnetic insertion layer 320' having a high spin polarization.

Thus, one or more of the free layers 110, 110', 110'', 200, 220, 220', 240, 260, 260', 300 and 300' may be used in a magnetic junction such as the magnetic junctions 100, 100' and 100''. Because of the gradient in critical switching current density and ferromagnetic coupling between the portions of the free layer, the overall switching current density of the free layer 110, 110', 110", 200, 220, 220', 240, 260, 260', 300 and/or 300' may be reduced. In addition, the free layer 110, 110', 110", 200, 220, 220', 240, 260, 260', 300 and/or 300' remains thermally stable. Thus, although a portion of the 110, 110', 110", 200, 220, 220', 240, 260, 260', 300 and/or 300' may have a higher switching current (which is typically undesirable), the combination of the critical switching current densities and ferromagnetic coupling between the portions/layers of the free layers 110, 110', 110", 200, 220, 220', 240, 260, 260', 300 and/or 300' result in a lower total switching current that may not otherwise be achieved for a thermally stable free layer. Consequently, performance of the magnetic junction 100, 100', and/or 100" may be improved.

Figure 14:
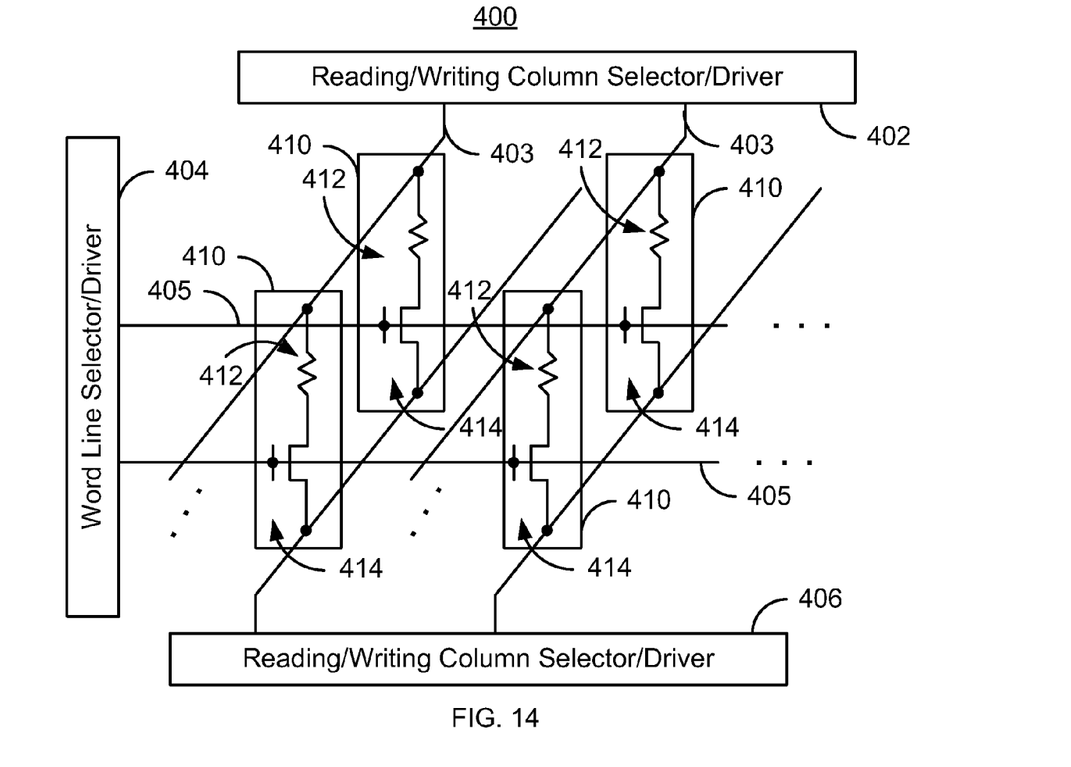
FIG. 14 depicts an exemplary embodiment of a memory utilizing magnetic junctions in the memory element(s) of the storage cell(s).

Further, the magnetic junctions 100, 100' and/or 100" and free layers 110, 110', 110", 200, 220, 220', 240, 260, 260', 300 and/or 300' may be used in a magnetic memory. FIG. 14 depicts an exemplary embodiment of one such memory 400. The magnetic memory 400 includes reading/writing column select drivers 402 and 406 as well as word line select driver 404. Note that other and/or different components may be provided. The storage region of the memory 400 includes magnetic storage cells 410. Each magnetic storage cell includes at least one magnetic junction 412 and at least one selection device 414. In some embodiments, the selection device 414 is a transistor. The magnetic junctions 412 may include one or more of the magnetic junctions 100, 100' and/or 100" and free layers 110, 110', 110", 200, 220, 220', 240, 260, 260', 300 and/or 300'. Although one magnetic junction 412 is shown per cell 410, in other embodiments, another number of magnetic junctions 412 may be provided per cell.

Because the magnetic memory 400 utilizes the magnetic junctions 100, 100' and/or 100" and free layers 110, 110', 110", 200, 220, 220', 240, 260, 260', 300 and/or 300', performance may be improved. In particular, a lower switching current may be used while maintaining thermal stability of the memory 400.

Figure 15:
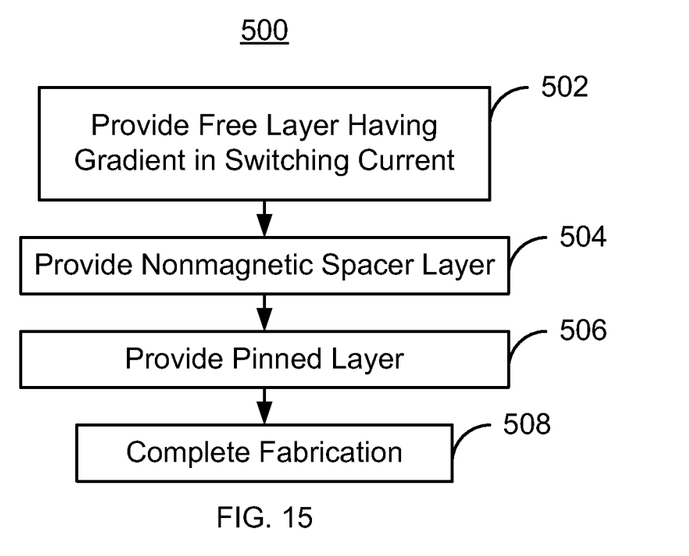
FIG. 15 an exemplary embodiment of a method for fabricating a magnetic junction including a free layer having a gradient in the critical switching current density and switchable using spin transfer.

FIG. 15 depicts an exemplary embodiment of a method 500 for fabricating magnetic junction, such as the magnetic junctions 100, 100', and/or 100". For simplicity, some steps may be omitted, combined, and/or interleaved. The method 500 is described in the context of the magnetic junction 100. However, the method 100 may be used on other magnetic junctions such as the junctions 100' and/or 100". Further, the method 500 may be incorporated into fabrication of magnetic memories. Thus the method 500 may be used in manufacturing a STT-MRAM 400 or other magnetic memory. The method 500 may also include providing optional seed layer(s), optional capping layer(s) and optional pinning layer (not shown).

The free layer 110 is provided, via step 502. Step 502 may include depositing the desired materials at the desired thickness of the free layer 110. More specifically, the free layer provided has the desired gradient in critical switching current density. In step 502, the layers 110, 110', 110", 200, 220, 220', 240, 260, 260', 300 and/or 300' are fabricated. Step 502 may include providing a SAF using one or more of the layers 110, 110', 110", 200, 220, 220', 240, 260, 260', 300 and/or 300'. The nonmagnetic layer 120 is provided, via step 504. Step 504 may include depositing the desired nonmagnetic materials, including but not limited to crystalline MgO. In addition, the desired thickness of material may be deposited in step 504.

The pinned layer 130 is provided, via step 506. Step 506 may include depositing the desired materials at the desired thickness of the pinned layer 130. Further, step 508 may include providing a SAF.

Fabrication is completed, via step 508. In some embodiments, step 508 includes fabricating an additional spacer layer such as the layer 140 and an additional pinned layer such as the layer 150. Optional capping and/or other layers may also be deposited in step 508. Thus, using the method 500, the benefits of the magnetic junctions 100, 100' and/or 100" and free layers 110, 110', 110", 200, 220, 220', 240, 260, 260', 300 and/or 300' may be achieved.

A method and system for providing a free layer having a gradient in critical switching current, a magnetic junction using such a free layer and a memory fabricated using the magnetic junction have been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction for use in a magnetic device comprising:
    a pinned layer;
    a nonmagnetic spacer layer; and
    a free layer having a gradient in a critical switching current density ($J_{c0}$) such that a first $J_{c0}$ of a first portion of the free layer is lower than a second $J_{c0}$ of a second portion of the free layer further from the nonmagnetic spacer layer than the first portion, the first portion of the free layer and the second portion of the free layer being ferromagnetically coupled such that the first portion of the free layer and the second portion of the free layer are magnetically aligned if the free layer is in a stable magnetic state of a plurality of stable magnetic states;
    wherein the magnetic junction is configured such that the free layer is switchable between the plurality of stable magnetic states when a write current is passed through the magnetic junction.

2. The magnetic junction of claim 1 wherein the free layer includes a plurality of magnetic layers, a first layer of the plurality of magnetic layers corresponding to the first portion of the free layer, a second layer of the plurality of magnetic layers corresponding to the second portion of the free layer, the second layer being further from the nonmagnetic spacer layer than the first layer.

3. The magnetic junction of claim 2 wherein the plurality of magnetic layers has a thermal stability gradient such that a first thermal stability of the first layer is lower than a second thermal stability of the second layer further from the nonmagnetic spacer layer than the first layer.

4. The magnetic junction of claim 2 wherein the gradient in the critical switching current density corresponds to an anisotropy gradient in a magnetic anisotropy ($H_k$) such that a first $H_k$ of the first layer is lower than a second $H_k$ of the second layer from the nonmagnetic spacer layer than the first layer.

5. The magnetic junction of claim 2 wherein the gradient in the critical switching current density corresponds to a magnetic gradient in a saturation magnetization ($M_s$) such that a first $M_s$ of the first layer is lower than a second $M_s$ of the second layer from the nonmagnetic spacer layer than the first layer.

6. The magnetic junction of claim 2 wherein the gradient in the critical switching current density corresponds an anisotropy gradient in a magnetic anisotropy ($H_k$) and a magnetic gradient in a saturation magnetization ($M_s$).

7. The magnetic junction of claim 6 wherein the anisotropy gradient is such that at least one of a first $H_k$ of the first layer is lower than a second $H_k$ of the second layer from the nonmagnetic spacer layer than the first layer and a first $M_s$ of the first layer is lower than a second $M_s$ of the second layer from the nonmagnetic spacer layer than the first layer.

8. The magnetic junction of claim 2 wherein the free layer has a perpendicular magnetic anisotropy and an out of plane demagnetization energy, the perpendicular magnetic anisotropy being greater than the out of plane demagnetization energy.

9. The magnetic junction of claim 2 wherein the plurality of magnetic layers have a plurality of thicknesses, the first layer having a first thickness, the second layer having a second thickness, the first thickness being greater than the second thickness.

10. The magnetic junction of claim 2 wherein the plurality of magnetic layers have a plurality of compositions.

11. The magnetic junction of claim 2 wherein the free layer further includes a plurality of nonmagnetic layers interleaved with the plurality of magnetic layers.

12. The magnetic junction of claim 11 wherein the plurality of nonmagnetic layers includes at least one of Pd, Pt, Bi, Tb.

13. The magnetic junction of claim 11 wherein the plurality of nonmagnetic layers has a constant thickness and wherein the plurality of magnetic layers has a plurality of thicknesses, the first layer having a first thickness, the second layer having a second thickness, the first thickness being less than the second thickness.

14. The magnetic junction of claim 11 wherein the plurality of nonmagnetic layers has a constant thickness and wherein the plurality of magnetic layers has a plurality of thicknesses, the first layer having a first thickness, the second layer having a second thickness, the first thickness being greater than the second thickness.

15. The magnetic junction of claim 11 wherein the plurality of magnetic layers has a constant thickness and wherein the plurality of nonmagnetic layers has a plurality of thicknesses, a first nonmagnetic layer of the plurality of nonmagnetic layers being closer to the nonmagnetic spacer layer than a second nonmagnetic layer of the plurality of nonmagnetic layers, the first layer having a first thickness, the second layer having a second thickness, the first thickness being less than the second thickness.

16. The magnetic junction of claim 11 wherein the plurality of magnetic layers includes at least one of Co, Fe and Ni.

17. The magnetic junction of claim 11 wherein the free layer further includes:
a magnetic insertion layer consisting of at least one of Co, Fe, CoFe, FeB, CoB, and CoFeB.

18. The magnetic junction of claim 17 wherein the magnetic insertion layer adjoins the nonmagnetic spacer layer.

19. A magnetic junction for use in a magnetic device comprising:
a pinned layer;
a nonmagnetic spacer layer; and
a free layer having a gradient in a critical switching current density ($J_{c0}$) such that a first $J_{c0}$ of a first portion of the free layer is lower than a second $J_{c0}$ of a second portion of the free layer further from the nonmagnetic spacer layer than the first portion, the free layer including a plurality of magnetic layers, a first layer of the plurality of magnetic layers corresponding to the first portion of the free layer, a second layer of the plurality of magnetic layers corresponding to the second portion of the free layer, the second layer being further from the nonmagnetic spacer layer than the first layer;
an additional nonmagnetic spacer layer, the free layer being between the nonmagnetic spacer layer and the additional nonmagnetic spacer layer; and an additional pinned layer, the additional nonmagnetic spacer layer being between the free layer and the additional pinned layer;
wherein the plurality of magnetic layers in the free layer includes a third layer having a third $J_{c0}$ lower than the second $J_{c0}$ of the second layer of the plurality of magnetic layers the third layer being closer to the additional nonmagnetic spacer layer than the second layer; and
wherein the magnetic junction is configured such that the free layer is switchable between a plurality of stable magnetic states when a write current is passed through the magnetic junction.

20. A magnetic junction for use in a magnetic device comprising:
a pinned layer;
a nonmagnetic spacer layer; and
a free layer having a gradient in a critical switching current density ($J_{c0}$) such that a first $J_{c0}$ of a first portion of the free layer is lower than a second $J_{c0}$ of a second portion of the free layer further from the nonmagnetic spacer layer than the first portion;
wherein the magnetic junction is configured such that the free layer is switchable between a plurality of stable magnetic states when a write current is passed through the magnetic junction;
wherein the free layer includes an alloy having at least one ferromagnetic material and at least one additional material, the at least one ferromagnetic material having at least a first gradient in concentration and the at least one additional material having at least a second gradient in concentration such that the free layer has the gradient in $J_{c0}$.

21. A magnetic memory comprising:
a plurality of magnetic storage cells, each of the plurality of magnetic storage cells including at least one magnetic junction, the at least one magnetic junction including a pinned layer, a nonmagnetic spacer layer, and a free layer, the free layer having a gradient in a critical switching current density ($J_{c0}$) such that a first $J_{c0}$ of a first portion of the free layer is lower than a second $J_{c0}$ of a second portion of the free layer further from the nonmagnetic spacer layer than the first portion, the first portion of the free layer and the second portion of the free layer being ferromagnetically coupled such that the first portion of the free layer and the second portion of the free layer are magnetically aligned if the free layer is in a stable magnetic state of a plurality of stable magnetic states, the magnetic junction being configured such that the free layer is switchable between the plurality of stable magnetic states when a write current is passed through the magnetic junction; and
a plurality of bit lines.

22. The magnetic memory of claim 21 wherein the free layer includes a plurality of magnetic layers, a first layer of the plurality of magnetic layers corresponding to the first portion of the free layer, a second layer of the plurality of magnetic layers corresponding to the second portion of the free layer, the second layer being further from the nonmagnetic spacer layer than the first layer.

23. The magnetic memory of claim 22 wherein the plurality of magnetic layers has a thermal stability gradient such that a first thermal stability of the first layer is lower than a second thermal stability of the second layer further from the nonmagnetic spacer layer than the first layer.

24. The magnetic memory of claim 22 wherein the gradient in the critical switching current density corresponds to an anisotropy gradient in a magnetic anisotropy ($H_k$) such that a first $H_k$ of the first layer is lower than a second $H_k$ of the second layer from the nonmagnetic spacer layer than the first layer.

25. The magnetic memory of claim 22 wherein the gradient in the critical switching current density corresponds to a magnetic gradient in a saturation magnetization ($M_s$) such that a first $M_s$ of the first layer is lower than a second $M_s$ of the second layer from the nonmagnetic spacer layer than the first layer.

26. The magnetic memory of claim 22 wherein the gradient in the critical switching current density corresponds an anisotropy gradient in a magnetic anisotropy ($H_k$) and a magnetic gradient in a saturation magnetization ($M_s$).

27. The magnetic memory of claim 22 wherein the free layer has a perpendicular magnetic anisotropy and an out of plane demagnetization energy, the perpendicular magnetic anisotropy being greater than the out of plane demagnetization energy.

28. The magnetic memory of claim 22 wherein the plurality of magnetic layers have a plurality of thicknesses, the first layer having a first thickness, the second layer having a second thickness, the first thickness being greater than the second thickness.

29. The magnetic memory of claim 22 wherein the plurality of magnetic layers have a plurality of compositions.

30. The magnetic memory of claim 22 wherein the free layer further includes a plurality of nonmagnetic layers interleaved with the plurality of magnetic layers.

31. The magnetic memory of claim 30 wherein the plurality of nonmagnetic layers includes at least one of Pd,Pt, Tb, Bi.

32. The magnetic memory of claim 30 wherein the plurality of nonmagnetic layers has a constant thickness and wherein the plurality of magnetic layers has a plurality of thicknesses, the first layer having a first thickness, the second layer having a second thickness, the first thickness being less than the second thickness.

33. The magnetic memory of claim 30 wherein the plurality of nonmagnetic layers has a constant thickness and wherein the plurality of magnetic layers has a plurality of thicknesses, the first layer having a first thickness, the second layer having a second thickness, the first thickness being greater than the second thickness.

34. The magnetic memory of claim 30 wherein the plurality of magnetic layers has a constant thickness and wherein the plurality of nonmagnetic layers has a plurality of thicknesses, a first nonmagnetic layer of the plurality of nonmagnetic layers being closer to the nonmagnetic spacer layer than a second nonmagnetic layer of the plurality of nonmagnetic layers, the first layer having a first thickness, the second layer having a second thickness, the first thickness being less than the second thickness.

35. The magnetic memory of claim 30 wherein the free layer further includes:
a magnetic insertion layer consisting of at least one of Co, Fe, CoFe, FeB, CoB, and CoFeB.

36. A magnetic memory comprising:
a plurality of magnetic storage cells, each of the plurality of magnetic storage cells including at least one magnetic junction, the at least one magnetic junction including a pinned layer, a nonmagnetic spacer layer, a free layer, an additional nonmagnetic spacer layer, and an additional pinned layer, the free layer being between the nonmagnetic spacer layer and the additional nonmagnetic spacer layer, the additional nonmagnetic spacer layer being between the free layer and the additional pinned layer, the free layer having a gradient in a critical switching current density ($J_{c0}$) such that a first $J_{c0}$ of a first portion of the free layer is lower than a second $J_{c0}$ of a second portion of the free layer further from the nonmagnetic spacer layer than the first portion, the free layer including a plurality of magnetic layers, a first layer of the plurality of magnetic layers corresponding to the first portion of the free layer, a second layer of the plurality of magnetic layers corresponding to the second portion of the free layer, the second layer being further from the nonmagnetic spacer layer than the first layer, the magnetic junction being configured such that the free layer is switchable between a plurality of stable magnetic states when a write current is passed through the magnetic junction, the plurality of magnetic layers in the free layer including a third layer having a third $J_{c0}$ lower than the second $J_{c0}$ of the second layer of the plurality of magnetic layers the third layer being closer to the additional nonmagnetic spacer layer than the second layer; and
a plurality of bit lines.

37. A magnetic memory comprising:
a plurality of magnetic storage cells, each of the plurality of magnetic storage cells including at least one magnetic junction, the at least one magnetic junction including a pinned layer, a nonmagnetic spacer layer, and a free layer, the free layer having a gradient in a critical switching current density ($J_{c0}$) such that a first $J_{c0}$ of a first portion of the free layer is lower than a second $J_{c0}$ of a second portion of the free layer further from the nonmagnetic spacer layer than the first portion, the free layer includes an alloy having at least one ferromagnetic material and at least one additional material, the at least one ferromagnetic material having at least a first gradient in concentration and the at least one additional material having at least a second gradient in concentration such that the free layer has the gradient in $J_{c0}$, the magnetic junction being configured such that the free layer is switchable between a plurality of stable magnetic states when a write current is passed through the magnetic junction; and
a plurality of bit lines.

38. A method for providing a magnetic junction for use in a magnetic device comprising:
providing a pinned layer;
providing a nonmagnetic spacer layer; and
providing a free layer having a gradient in a critical switching current density ($J_{c0}$) such that a first $J_{c0}$ of a first portion of the free layer is lower than a second $J_{c0}$ of a second portion of the free layer further from the nonmagnetic spacer layer than the first portion, the first portion of the free layer and the second portion of the free layer being ferromagnetically coupled such that the first portion of the free layer and the second portion of the free layer are aligned if the free layer is in a stable magnetic state of a plurality of stable magnetic states;
wherein the magnetic junction is configured such that the free layer is switchable between a plurality of stable magnetic states when a write current is passed through the magnetic junction.

39. The method of claim 38 wherein the free layer includes a plurality of magnetic layers, a first layer of the plurality of magnetic layers corresponding to the first portion of the free layer, a second layer of the plurality of magnetic layers corresponding to the second portion of the free layer, the second layer being further from the nonmagnetic spacer layer than the first layer.

40. The method of claim 38 wherein the free layer includes an alloy having at least one ferromagnetic material and at least one additional material, the at least one ferromagnetic material having at least a first gradient in concentration and the at least one additional material having at least a second gradient in concentration such that the free layer has the gradient in $J_{c0}$.

41. The method of claim 40 wherein the step of providing the free layer further includes:
   co-sputtering the at least one magnetic material and the at least one additional material from a plurality of sputtering targets.

42. The method of claim 40 wherein the step of providing the free layer further includes:
   depositing the free layer; and
   annealing the free layer after the step of depositing the free layer.

43. The method of claim 42 wherein the step of annealing the free layer further includes:
   annealing the free layer in situ.

44. The method of claim 42 wherein the step of annealing the free layer further includes:
   annealing the free layer ex situ.

* * * * *